(12) United States Patent
Liao et al.

(10) Patent No.: US 7,859,272 B2
(45) Date of Patent: Dec. 28, 2010

(54) METHOD FOR MEASURING SPEED OF CONDUCTOR SLIPPING THROUGH CAPACITIVE SENSOR

(75) Inventors: Tung-Tsai Liao, Hsin Chu (TW); Li Sheng Lo, Hsin Chu County (TW)

(73) Assignee: Generalplus Technology, Inc., Hsin-Chu (TW)

( * ) Notice: Subject to any disclaimer, the term of this patent is extended or adjusted under 35 U.S.C. 154(b) by 171 days.

(21) Appl. No.: 11/984,412

(22) Filed: Nov. 16, 2007

(65) Prior Publication Data
US 2009/0021269 A1 Jan. 22, 2009

(30) Foreign Application Priority Data
Jul. 19, 2007 (TW) ............... 96126286 A

(51) Int. Cl.
*G01R 27/26* (2006.01)
(52) U.S. Cl. ....................... 324/678; 324/686
(58) Field of Classification Search ................ 324/678, 324/686
See application file for complete search history.

(56) References Cited

U.S. PATENT DOCUMENTS

2007/0032967 A1* 2/2007 Feen et al. .................. 702/47
2008/0042971 A1* 2/2008 Sachs ......................... 345/156

\* cited by examiner

*Primary Examiner*—Amy He
(74) *Attorney, Agent, or Firm*—Muncy, Geissler, Olds & Lowe, PLLC

(57) ABSTRACT

A method for measuring a speed of a conductor slipping through a capacitive sensor. The method includes: sampling a capacitance of a sensing electrode at each preset time; determining a first threshold value and a second threshold value according to a peak value of the capacitance when the capacitance achieves the peak value; and determining the speed of the conductor slipping through the capacitive sensor by the first period and the second period, wherein the first period is defined as a period of time ranging from the time when the capacitance reaches the first threshold value to the time when the capacitance reaches the peak value and the second period is defined as a period of time ranging from the time when the capacitance reaches the peak value to the time when the capacitance reaches the second threshold value.

5 Claims, 8 Drawing Sheets

METHOD FOR MEASURING SPEED OF CONDUCTOR SLIPPING THROUGH CAPACITIVE SENSOR

This application claims the benefit of the filing date of Taiwan Application Ser. No. "096126286", filed on "Jul. 19, 2007", the content of which is incorporated herein by reference.

BACKGROUND OF THE INVENTION

1. Field of the Invention

The present invention relates to a touch sensor, and more particularly to a method for measuring speed of a conductor slipping through a capacitive sensor.

2. Description of the Related Art

In recent years, due to the development of technology, control buttons, such as buttons of an elevator or a game console, evolve from a mechanical type of button into a touch sensor. FIG. 1 is a circuit diagram depicting a capacitive touch sensor in the prior art. Referring to FIG. 1, the touch sensor includes a sensing electrode 101, a resistor 102 and a sensing-control terminal 103, wherein the sensing electrode 101 in the circuit is equivalent to a grounding capacitor Cx.

FIG. 2 illustrates an operational waveform diagram of a node A coupled to the sensing electrode 101 and the resistor 102. Referring to FIGS. 1 and 2, the sensing-control terminal 103 charges the node A to a first preset voltage V20 at the beginning, and then the node A is set to high-impedance. Afterward, since the sensing electrode 101 is equivalent to the grounding capacitor Cx, the sensing electrode 101 starts to discharge through the resistor 102. The sensing-control terminal 103 continuously detects a voltage of node A. When the voltage of node A discharges to a second preset voltage V21, the sensing-control terminal 103 determines whether a finger touches the sensing electrode according to a period when the voltage of node A is discharged from the first preset voltage V20 to the second preset voltage, and then the sensing-control terminal 103 begins to charge the node A.

Referring to FIG. 2, the waveform 201 is a voltage waveform of node A when the finger does not touch the sensing electrode 101, and the waveform 202 is a voltage waveform of node A when the finger touches the sensing electrode 101. According to the waveforms, when the finger touches the sensing electrode 101, the equivalent capacitor of the sensing electrode 101 is increased so that a discharge time T2 of the waveform 202 is longer than a discharge time T1 of the waveform 201. Therefore, as long as it is determined that the period when the voltage of node A is discharged from the first preset voltage V20 to the second preset voltage V21 is longer than the discharge time T1 by the sensing-control terminal, it can be determined that the sensing electrode 101 is touched.

In a specific application, especially a game console, it may be necessary to sense the speed of a conductor slipping through a capacitive sensor. FIG. 3 illustrates a waveform depicting the variation of the equivalent capacitor of the sensing electrode 101 when a conductor slips through the sensing electrode. Referring to FIG. 3, a conventional method for measuring the speed of a conductor (such as finger) moving through the sensing electrode 101 is to determine the speed according to a period from the time when the conductor is connected with the sensing electrode 101 to the time when the conductor is disconnected from the sensing electrode 101. The abovementioned period is determined according to the variation of the equivalent capacitance Cx of the sensing electrode 101 with respect to the time. Generally speaking, the equivalent capacitance Cx can be obtained by the variation of Cx with respect to the time. The conventional method includes:

the first step of presetting a first threshold capacitance CT1 (the higher threshold value) and a second threshold capacitance CT2 (the lower threshold value);

the second step of determining whether the estimated value of the equivalent capacitance Cx is in excess of the first threshold capacitance CT1;

the third step of starting to count the time when the equivalent capacitance Cx is in excess of the first threshold capacitance CT1; and the fourth step of stopping to count the time when the equivalent capacitance Cx is lower than the second threshold capacitance CT2, and then determining the time when the conductor slips through the sensing electrode 101 according to the counted time.

However, if the human finger is used, for example, each person has a different finger condition, and thus the different finger pressure and the different contact area between the human finger and the sensing electrode 101. FIG. 4 illustrates a waveform depicting the variation of the equivalent capacitance of the sensing electrode 101 when the finger slightly slips through the sensing electrode 101. Referring to FIG. 4, when the finger slightly slips through the sensing electrode 101, the finger and the sensing electrode do not tightly contact with each other. Thus, the variation of the equivalent capacitance Cx is relatively small. If the equivalent capacitance Cx is just smaller than the first threshold capacitance CT1, the abovementioned third step cannot be triggered. In addition, even if the equivalent capacitance Cx is just larger than the first threshold capacitance CT1, the measured time may not be precise since the equivalent capacitance Cx is too small.

In addition, the surface material of the sensing electrode 101 is generally made of plastics, such as polyethylene, polypropylene, and so on. In this type of the capacitive sensor, the sensing electrode 101 tends to be comparatively influenced by the electrostatic charges on its surface material. This kind of plastics, such as polyethylene, polypropylene, and so on, has a characteristic that the accumulated electrostatic charges therein are hard to be eliminated. FIG. 5 illustrates a waveform depicting the variation of the equivalent capacitance of the sensing electrode 101 when the sensing electrode 101 is affected by the electrostatic charges. Referring to FIG. 5, when the finger operates on the abovementioned plastics, the electrostatic charges will be gradually induced into or out of the plastics so that the electrical field of the surface of the sensing electrode 101 will be changed. As the electrostatic charges on the surface of the sensing electrode 101 change, the waveform of the equivalent capacitance may vary in a manner similar to the variations of the waveforms 51 or 52. Therefore, the measured time Tn may be influenced and becomes Ts or T1.

Hence, the inaccuracy is induced as long as the speed of a conductor slipping through the sensing electrode is determined according to the simple settings of the first threshold capacitance CT1 and the second threshold capacitance CT2.

SUMMARY OF THE INVENTION

In view of the above-mentioned problems, the present invention is direct to a method for measuring speed of a conductor slipping through a capacitive sensor to increase the accuracy of the speed sensing.

To achieve the above-mentioned object and others, a method for measuring speed of a conductor slipping through a capacitive sensor is provided in the present invention. The method comprises the steps of: sampling a value of a capacitance of a sensing electrode at each preset time; determining a first threshold value and a second threshold value according to a peak value of the capacitance when the capacitance reaches the peak value; and determining the speed of the conductor slipping through the capacitive sensor according to a first period and a second period, wherein the first period is defined as a period of time ranging from the time when the capacitance reaches the first threshold value to the time when the capacitance reaches the peak value, and the second period is defined as a period of time ranging from the time when the capacitance reaches the peak value to the time when the capacitance reaches the second threshold value.

According to the method for measuring the speed of the conductor slipping through the capacitive sensor in the embodiment of the present invention, the method further comprises the steps of: providing a discharge element, a sensing-control terminal and an input-output control terminal, wherein the discharge element is coupled between the sensing-control terminal and the input-output control terminal, and the sensing electrode is coupled to the sensing-control terminal; setting a voltage of the input-output control terminal to a first common voltage and the sensing-control terminal to high-impedance when a voltage of the sensing-control terminal is charged to a first voltage; setting the voltage of the sensing-control terminal to the first common voltage for a preset period and then setting the sensing-control terminal to high-impedance, and setting the voltage of the input-output control terminal to a second common voltage when the voltage of the sensing-control terminal is discharged from the first voltage to a second voltage; charging the sensing-control terminal to the first voltage and then setting the voltage of the input-output control terminal to the first common voltage and then setting the sensing-control terminal to high-impedance when the voltage of the sensing-control terminal is charged from the first common voltage to a third voltage; and determining the value of the capacitance according to a period during which the voltage of the sensing-control terminal is discharged from the first voltage to the second voltage plus a period during which the voltage of the sensing-control terminal is charged from the first common voltage to the third voltage. Thus, the electrostatic influence can be prevented.

The essence of the present invention is to continuously sample and record the capacitance of the sensing electrode, and provide a first threshold value and a second threshold value according to the capacitance when the peak of the capacitance occurs. Then, the speed of a conductor slipping through a capacitive sensor is estimated according to a first time when the capacitance overtakes the first threshold and a second time when the capacitance reduces to the second threshold. Hence, the speed of conductor slipping through the capacitive sensor can be accurately estimated when either the conductor tightly contacts with the sensing electrode or not.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

EMBODIMENT OF THE INVENTION

Figure 1:
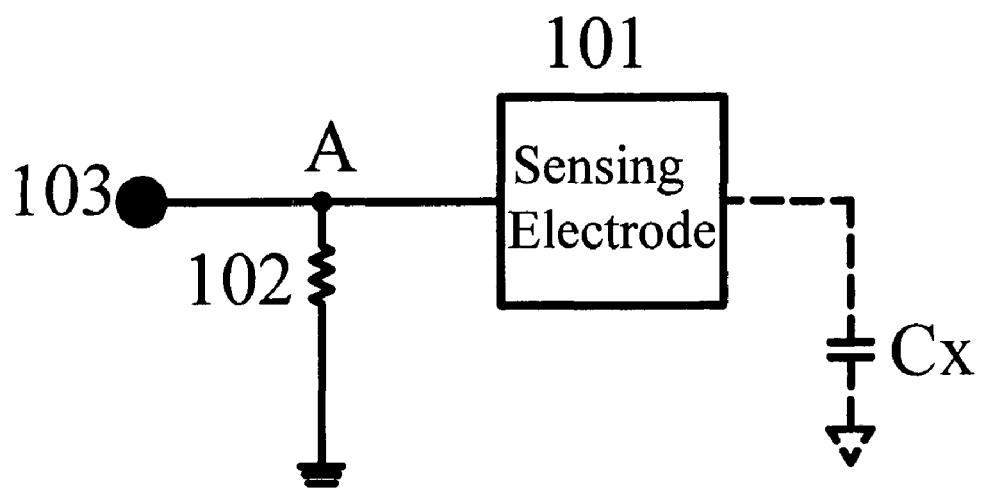
FIG. 1 is a circuit diagram depicting a touch sensor in the prior art.
Figure 2:
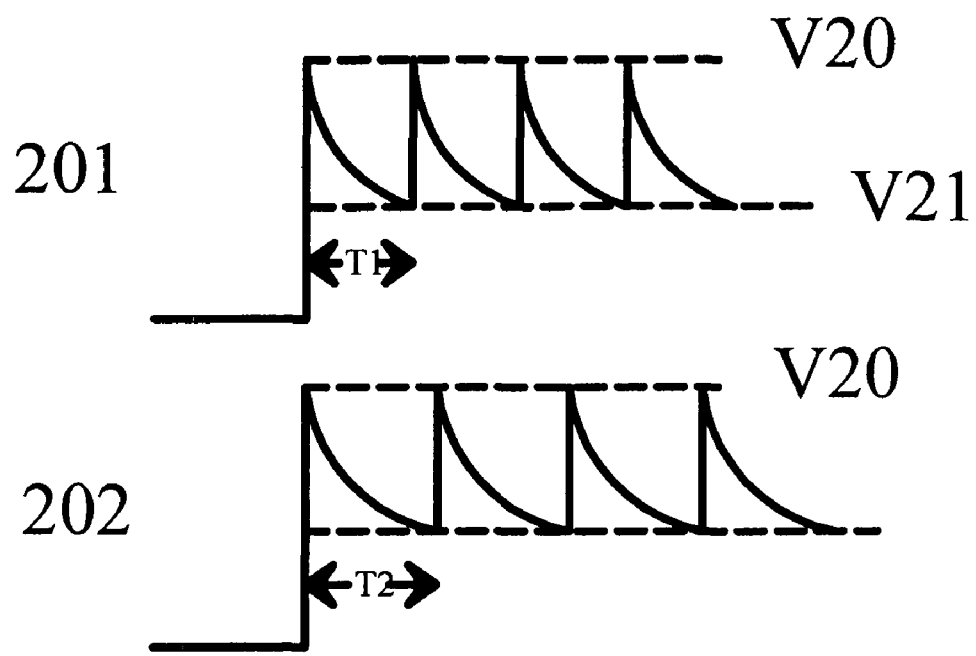
FIG. 2 illustrates an operational waveform diagram of node A coupled by the sensing electrode 101 and the resistor 102 in the prior art.
Figure 6:
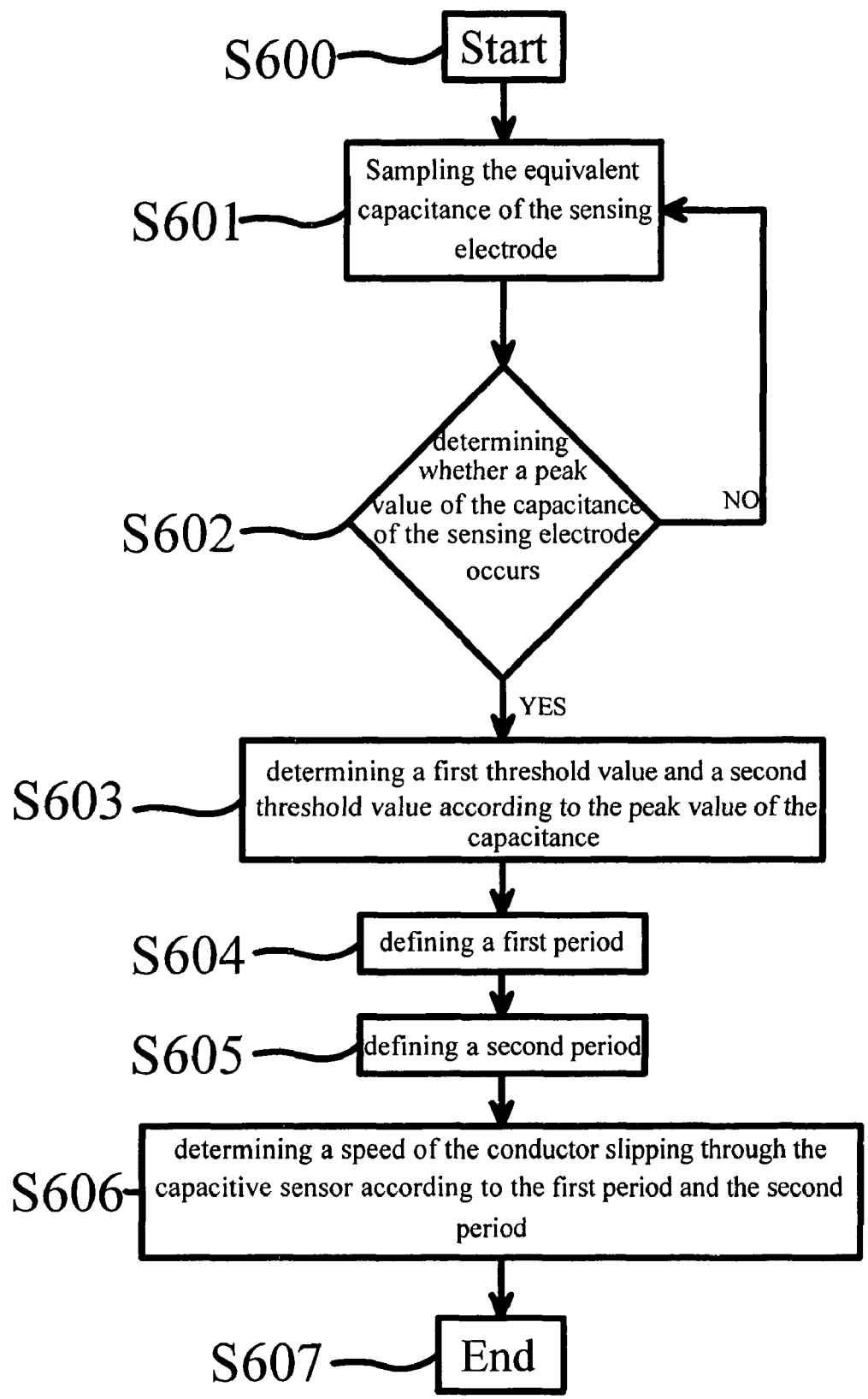
FIG. 6 is a flow chart depicting a method for measuring speed of a conductor slipping through a capacitive sensor according to the embodiment of the present invention.

FIG. 6 is a flow chart depicting a method for measuring speed of a conductor slipping through a capacitive sensor according to the embodiment of the present invention. Referring to FIGS. 6 and 1, the method includes the following steps.

Step S600: Start.

In step S601, a value of a capacitance of a sensing electrode is sampled at each preset time. In this step, the sampled capacitance and sampling time are recorded according its sampling sequence.

In step S602, it is determined whether a peak value of the capacitance Cx of the sensing electrode 101 occurred. In simple terms, the peak value is a highest value from the rising of the capacitance Cx to the falling of the capacitance Cx. If the peak value does not happen, the procedure returns to step S601.

In step S603, when the peak value of the sampled capacitance Cx happens, a first threshold value and a second threshold value are determined according to a peak value of the capacitance. Generally speaking, when the peak value is reached, the contact area between a conductor and the sensing electrode 101 reaches the maximum. In addition, the condition for the implementation of the step usually corresponds to the firmware of the capacitive sensor storing the proportional relationships between the peak value, the first threshold value and the second threshold value. When the peak value is captured, the first threshold value and the second threshold value can be generated.

In step S604, a first period is defined as a period from the time when the capacitance Cx achieves the first threshold value to the time when the capacitance Cx achieves the peak value.

In step S605, a second period is defined as a period from the time when the capacitance Cx achieves the peak value to the time when the capacitance Cx achieves the second threshold value.

In step S606, a speed of the conductor slipping through the capacitive sensor is determined according to the first period and the second period.

Step S607: End.

According to the abovementioned embodiment, it should be noted that the sampled capacitance and its sampling time are recorded in the embodiment. Thus, if the peak value occurs, a time point of the first threshold value can be obtained. Also, the time can be considered to be a time when a conductor starts to connect with the sensing electrode. Therefore, as long as the time point when the capacitance passes through the second threshold value is sampled, the speed of the conductor slipping through the capacitive sensor can be determined according to the time difference between the time when the capacitance rises to the first threshold value and the time when the capacitance falls to the second threshold value. In addition, the method can prevent the detecting error from occurring due to the different areas between the different fingers or the different conductors connected with the sensing electrode.

A method for measuring the speed of the conductor slipping through capacitive sensor is provided in the abovementioned embodiment. However, most of the material between the sensing electrode and its connected conductor is generally made of plastic which is easily affected by electrostatic charges. Thereinafter, a different circuit topology of the capacitive sensor and its operating method is further provided to prevent the influence of electrostatic charges.

Figure 7A:
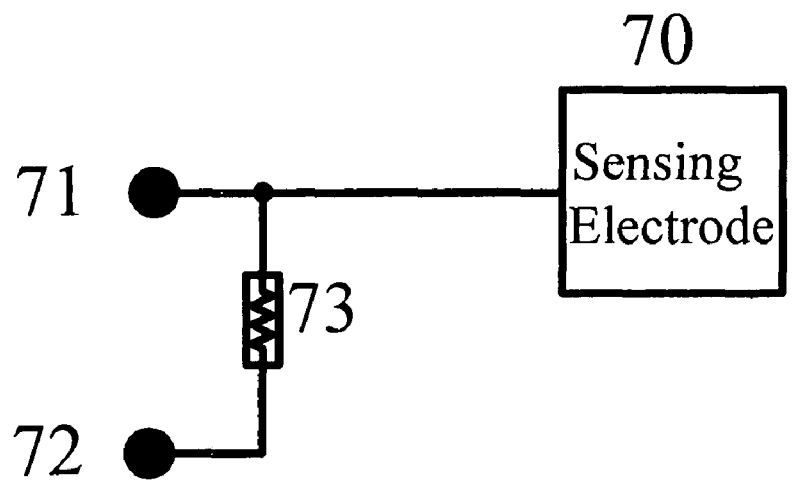
FIG. 7A illustrates a circuit block diagram according to the embodiment of the present invention.
Figure 7B:
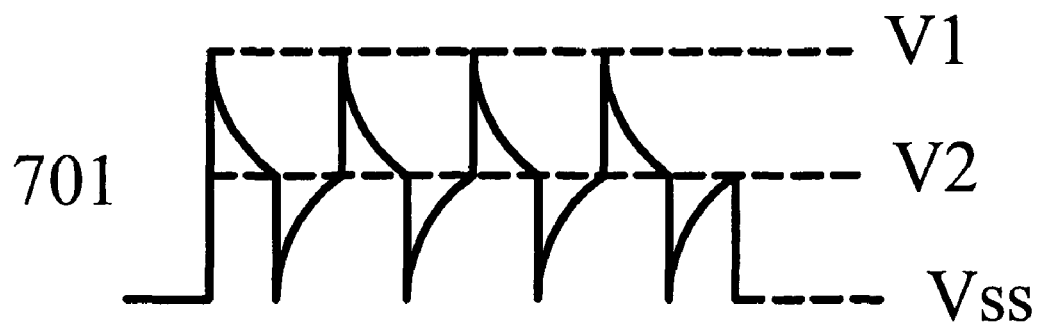
FIG. 7B illustrates the operational waveforms according to the embodiment of the present invention.
Figure 7B:
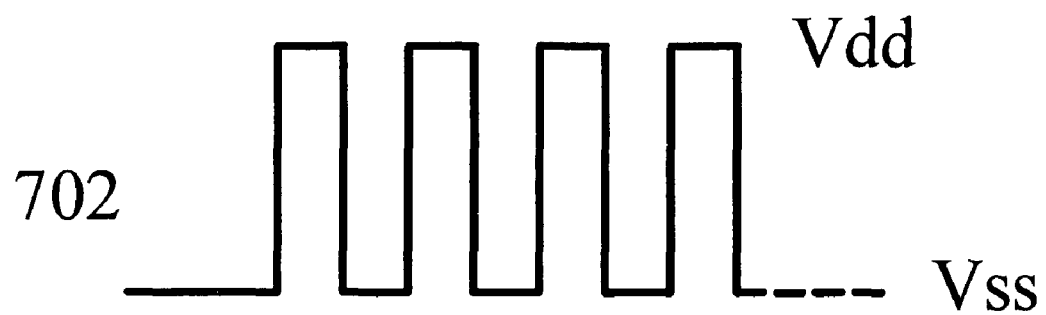
Figure 8:
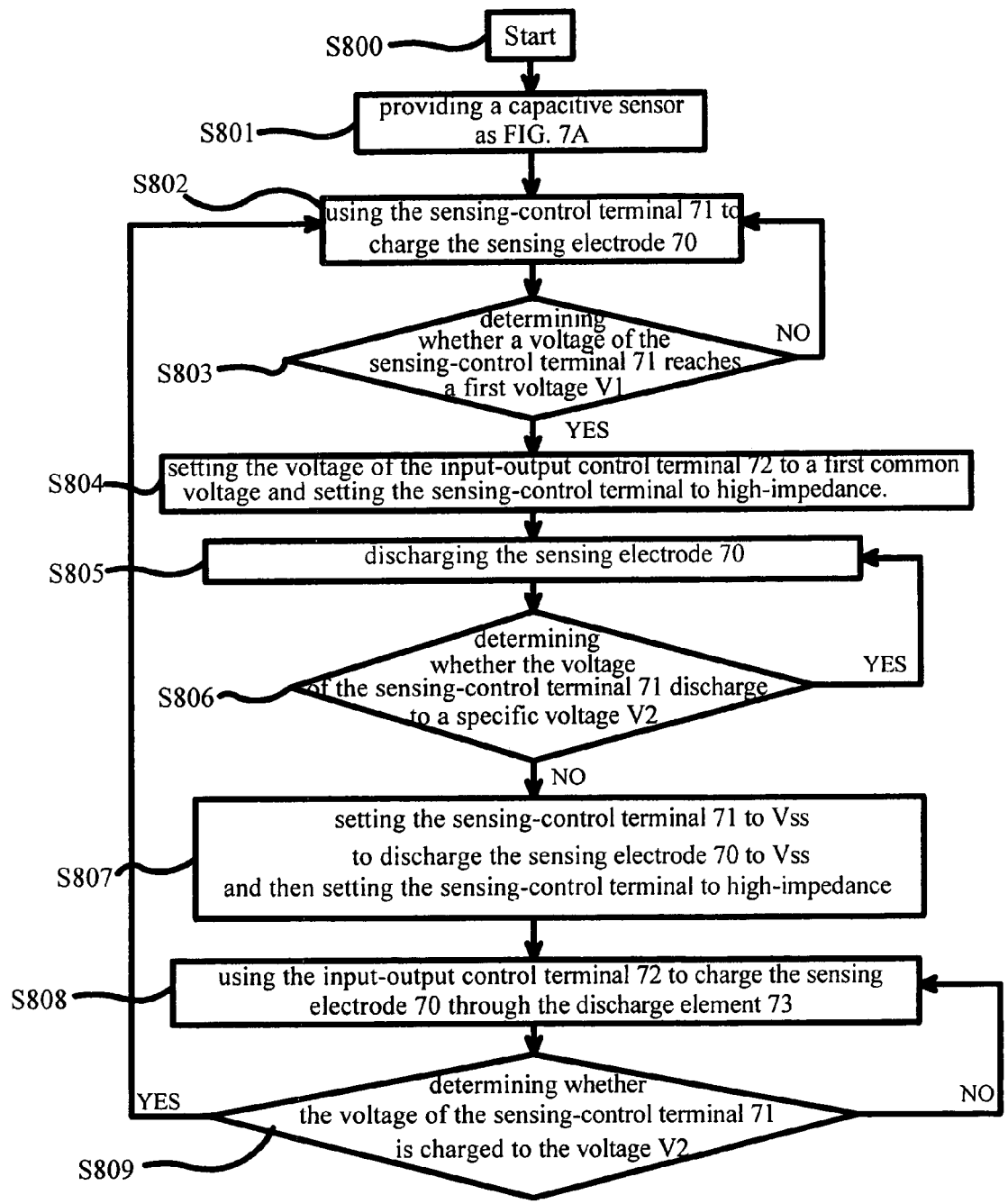
FIG. 8 is a flow chart depicting the operation of the FIG. 7 according to the embodiment of the present invention.

FIG. 7A illustrates a circuit block diagram according to the embodiment of the present invention. Referring to FIG. 7A, the circuit includes a sensing electrode 70, a sensing-control terminal 71, an input-output control terminal 72, and a discharge element 73. The coupling relationship thereof is shown in the FIG. 7A. FIG. 7B illustrates the operational waveforms according to the embodiment of the present invention. Referring to FIG. 7B, the waveform 701 is the voltage waveform at the sensing-control terminal 71. The waveform 702 is a waveform at the input-output control terminal 72. FIG. 8 is a flow chart depicting the operation of the FIG. 7 according to the embodiment of the present invention. Referring to FIGS. 7A, 7B and 8, the method includes the following steps.

Step S800: Start.

In step S801, a capacitive sensor is provided, as shown in FIG. 7A.

In step S802, the sensing-control terminal 71 is adopted to charge the sensing electrode 70.

In step S803, it is determined whether a voltage of the sensing-control terminal 71 reaches a first voltage V1. When the determination is negative, the procedure returns to the step S802 to continue to charge the sensing electrode 70.

In step S804, when the voltage of the sensing-control terminal 71 reaches the first voltage V1, the voltage of the input-output control terminal 72 is set to a first common voltage Vss and the sensing-control terminal is set to high-impedance.

In step S805, the sensing electrode 70 discharges the input-output control terminal 72 through the discharge element 73.

In step S806, it is determined whether the voltage of the sensing-control terminal 71 is discharged to a specific voltage V2. When the determination is negative, the procedure returns to the step S805 to continue to discharge the sensing electrode 70.

In step S807, when the voltage of the sensing-control terminal 71 is discharged to the specific voltage V2, the sensing-control terminal 71 is set to the first common voltage Vss to discharge the sensing electrode 70 to the common voltage Vss. Afterward, the sensing-control terminal 71 is set to high-impedance. In addition, the input-output control terminal 72 is set to the second common voltage Vdd.

In step S808, the input-output control terminal 72 is adopted to charge the sensing electrode 70 through the discharge element 73.

In step S809, it is determined whether the voltage of the sensing-control terminal 71 is charged to the voltage V2. When the voltage of the sensing-control terminal 71 reaches the voltage V2, the procedure returns to the step S802.

Since the equivalent capacitance of the sensing electrode 70 will not be changed when the sensing electrode 70 is not touched, the voltage waveform measured at sensing-control terminal 71 is a periodic waveform. When the sensing electrode 70 is touched by a conductor, the equivalent capacitance of the sensing electrode 70 will be increased, and the period of the voltage waveform measured at sensing-control terminal 71 will be increased. Thus, the variation of the equivalent capacitance of the sensing electrode 70 can be determined according to the period and its voltage variation which are obtained in the steps S802 to S809.

Although the embodiment is illustrated utilizing FIGS. 7A, 7B and 8 as the example, one of ordinary skill in the art should understand the abovementioned voltages V1, V2, Vss and Vdd can be changed according to different situations. In general situation, the common voltage Vdd is a power supply voltage, and the common voltage is a ground voltage. In addition, the charged target for the sensing electrode 70 needs not to be chosen as the voltage V2. Thus, the present invention is not limited to the abovementioned voltage. In addition, the discharge element 73 is generally implemented by a resistor or its equivalent element.

Figure 9A:
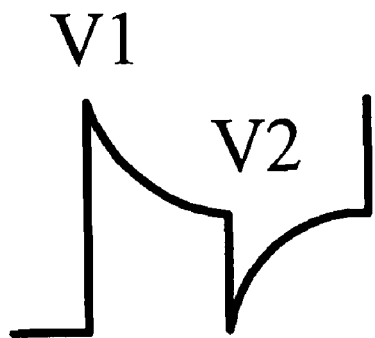
FIG. 9A illustrates an operational waveform diagram when the sensing electrode has no charges according to the embodiment of the present invention.
Figure 9B:
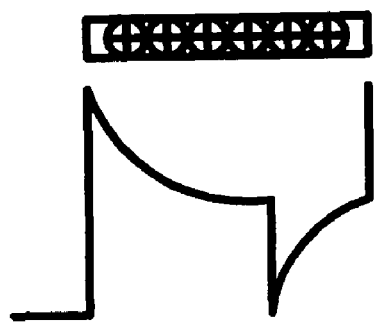
FIG. 9B illustrates an operational waveform diagram when the sensing electrode has positive charges according to the embodiment of the present invention.
Figure 9C:
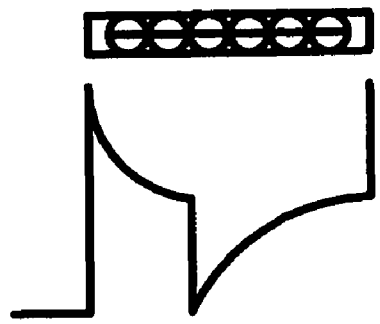
FIG. 9C illustrates an operational waveform diagram when the sensing electrode has negative charges according to the embodiment of the present invention.

FIGS. 9A to 9C respectively represent operational waveforms when the sensing electrode 70 has no charges, positive charges and negative charges according to the embodiment of the present invention. Referring to FIGS. 9A and 9B, when a surface of the sensing electrode 70 has positive charges, the period during which the voltage of the sensing electrode 70 is discharged from the voltage V1 to the voltage V2 will be lengthened, but the period during which the voltage of the sensing electrode 70 is charged from the common voltage Vss to the voltage V2 will be comparatively shortened. Next, as shown in FIGS. 9A and 9C, when the surface of the sensing electrode 70 has negative charges, the period during which the voltage of the sensing electrode 70 is discharged from the voltage V1 to the Voltage V2 will be shortened, but the period during which the voltage of the sensing electrode 70 is charged from the common voltage Vss to the voltage V2 will be comparatively lengthened. Thus, when the electrostatic charges on the sensing electrode 70 are either positive charges or negative charges, a corresponding charge period or discharge period will be lengthened, and the other charge period or discharge period will be shortened. In other words, when the electrostatic charges on the sensing electrode 70 are either positive charges or negative charges, the sum of its charge period and its discharge period is almost equal to the sum of the charge and discharge periods when there is no electrostatic charge on the sensing electrode 70. Therefore, the circuit and its operation can reduce the error of the estimation of the equivalent capacitance caused by the electrostatic charges. In addition, the estimation of the equivalent capacitance can become more accurate.

Figure 3:
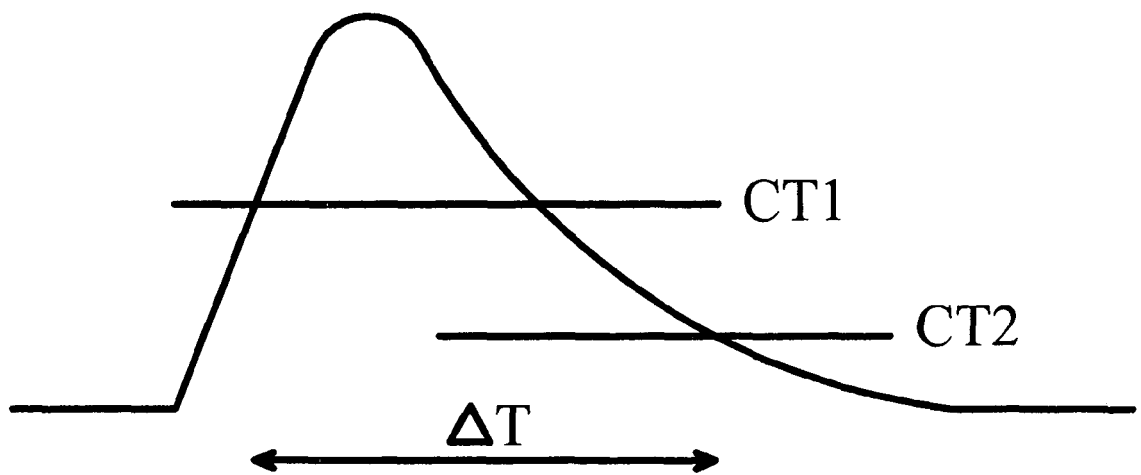
FIG. 3 illustrates a waveform depicting the variation of the equivalent capacitance Cx of the sensing electrode 101 when a conductor slips through the sensing electrode 101.
Figure 4:
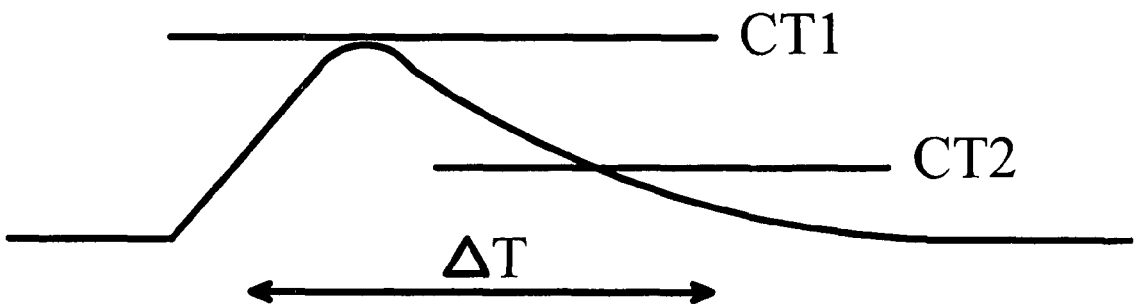
FIG. 4 illustrates a waveform when a finger slightly slips through the sensing electrode 101 in the prior art.
Figure 5:
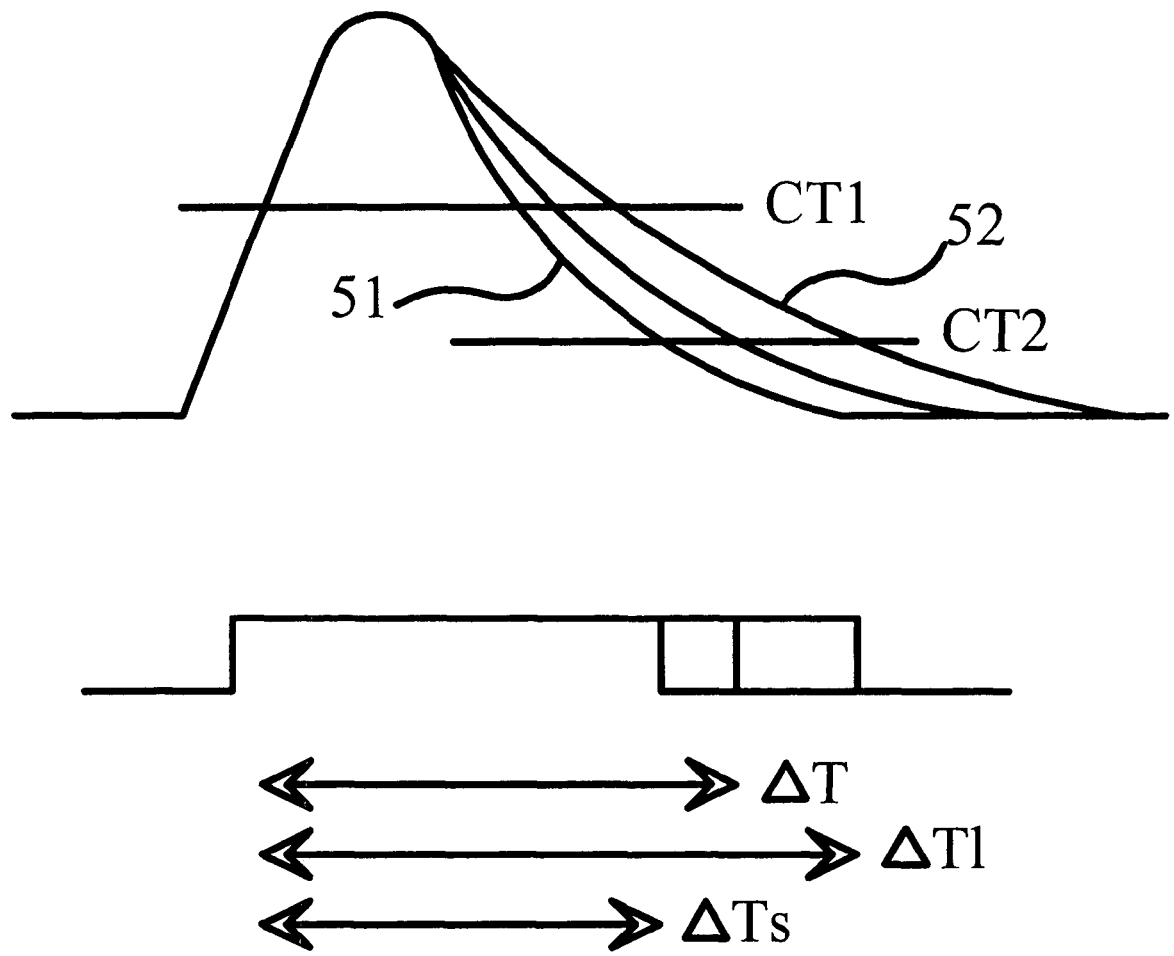
FIG. 5 illustrates a waveform depicting the variation of the equivalent capacitance Cx of the sensing electrode 101 when the sensing electrode 101 is affected by the electrostatic charges.
Figure 10:
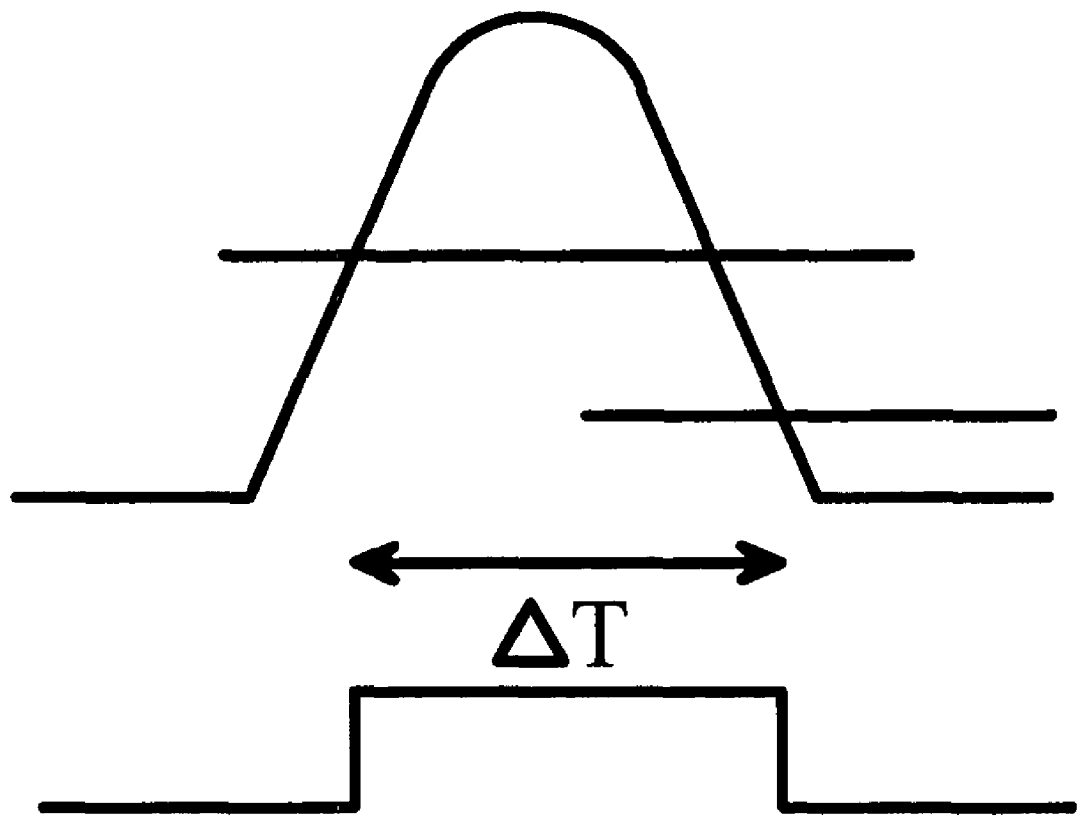
FIG. 10 illustrates a waveform depicting the variation of the equivalent capacitance of the sensing electrode 70 when a finger slips through the sensing electrode 70 according to the embodiment of the present invention.

FIG. 10 illustrates a waveform depicting the variation of the equivalent capacitance of the sensing electrode 70 when a finger slips through the sensing electrode 70 according to the embodiment of the present invention. Referring to FIGS. 10 and 3, the variation of the equivalent capacitance in FIG. 10 is obviously more symmetrical than the variation of the equivalent capacitance in FIG. 3. In other words, the method for measuring the equivalent capacitance of the sensing electrode in the prior art is affected by the electrostatic charges to cause the asymmetric waveform of the equivalent capacitance. Because the circuit topology is changed to that in FIG. 7, the influence of the electrostatic can be avoided. Thus, the topology can make the equivalent capacitance be more precisely measured. Relatively, the accuracy of the measured speed of the conductor slipping through capacitive sensor is greatly enhanced. In coordination with the abovementioned method depicted in FIG. 6, defining the threshold value according to the peak value can prevent inaccuracy of measurement of the capacitance and failure of measurement which are caused by different operations or the amplitudes of the measured capacitance.

To sum up, the essence of the present invention is to continuously sample and record the capacitance of the sensing electrode, and provide a first threshold value and a second threshold value according to the capacitance when the peak of the capacitance occurs. Then, the speed of the conductor slipping through the capacitive sensor is estimated according to a first time when the capacitance passes through the first threshold value and a second time value when the capacitance is reduced to the second threshold. Hence, the speed of the conductor slipping through the capacitive sensor can be accurately estimated when either the conductor tightly contacts with the sensing electrode or not.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A method for measuring a speed of a conductor slipping through a capacitive sensor, the method comprising:
   (a) sampling a value of a capacitance of a sensing electrode at each preset time;
   determining a first threshold value and a second threshold value according to a peak value of the capacitance when the value of the sampled capacitance reaches the peak value;
   obtaining a first time point when the value of the present sampled capacitance reached the first threshold according to the sampled values sampled by the step (a);
   obtaining a second time point when the value of the present sampled capacitance reached the peak value according to the sampled values sampled by the step (a);
   obtaining a third time point when the value of the present sampled capacitance reached the second threshold according to the sampled values sampled by the step (a); and
   determining the present speed of the conductor slipping through the capacitive sensor by a first period and a second period,
   wherein the first period is defined as a period of time from the first time point to the second time point, and the second period is defined as a period of time from the second time point to the third time point.

2. The method according to claim 1, further comprising:
   providing a discharge element, a sensing-control terminal and an input-output control terminal, wherein the discharge element is coupled between the sensing-control terminal and the input-output control terminal, and the sensing electrode is coupled to the sensing-control terminal;
   setting a voltage of the input-output control terminal to a first common voltage and the sensing-control terminal to high-impedance when a voltage of the sensing-control terminal is charged to a first voltage;
   setting the voltage of the sensing-control terminal to the first common voltage for a preset period and then setting the sensing-control terminal to high-impedance, and setting the voltage of the input-output control terminal to a second common voltage when the voltage of the sensing-control terminal is discharged from the first voltage to a second voltage;
   charging the sensing-control terminal to the first voltage and then setting the voltage of the input-output control terminal to the first common voltage and then setting the sensing-control terminal to high-impedance when the voltage of the sensing-control terminal is charged from the first common voltage to a third voltage; and
   determining the value of the capacitance according to a period during which the voltage of the sensing-control terminal is discharged from the first voltage to the second voltage plus a period during which the voltage of the sensing-control terminal is charged from the first common voltage to the third voltage.

3. The method according to claim 2, wherein the first common voltage is a ground voltage.

4. The method according to claim 2, wherein the second voltage and the third voltage are between the first voltage and the first common voltage.

5. The method according to the claim 2, wherein the discharge element is a resistor.

* * * * *